US006303413B1

(12) United States Patent
Kalnitsky et al.

(10) Patent No.: US 6,303,413 B1
(45) Date of Patent: Oct. 16, 2001

(54) METHOD OF FORMING A SHALLOW AND DEEP TRENCH ISOLATION (SDTI) SUITABLE FOR SILICON ON INSULATOR (SOI) SUBSTRATES

(75) Inventors: Alexander Kalnitsky, Portland, OR (US); Dmitri A. Choutov, San Jose, CA (US); Robert F. Scheer, Portland, OR (US); Fanling H. Yang, Beaverton, OR (US); Thomas W. Dobson; Tadanori Yamaguchi, both of Portland, OR (US); Geoffrey C. Stutzin, San Carlos, CA (US); Ken Liao, Beaverton, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/564,178

(22) Filed: May 3, 2000

(51) Int. Cl.[7] .................................................. H01L 21/00
(52) U.S. Cl. ...................... 438/151; 438/296; 438/424; 438/435; 438/437; 437/67; 437/72; 430/314
(58) Field of Search ..................... 438/151, 424, 438/435, 296, 437; 437/67, 72; 430/314

(56) References Cited

U.S. PATENT DOCUMENTS 5,516,625 * 5/1996 McNamara et al. ................. 430/314
5,589,415 * 12/1996 Blanchard ............................. 437/57
5,719,085 * 2/1998 Moon et al. .......................... 438/424

* cited by examiner

Primary Examiner—Amir Zarabian
Assistant Examiner—Pho Luu
(74) Attorney, Agent, or Firm—Blakely, Sokoloff, Taylor & Zafman LLP

(57) ABSTRACT

A method of forming a shallow-deep trench isolation (SDTI) is provided that includes the steps of forming a pair of deep trenches through a silicon on insulator (SOI) layer without substantially disturbing an underlying buried oxide (BOX) layer. Once the deep trenches are formed, the trenches are filed with suitable electrical isolating materials, such as undoped poly-silicon or dielectric material, and etched back to obtain a substantially planarized top surface. Subsequently, an active nitride layer is deposited on the planarized top surface, and then a pair of shallow trenches are formed. The shallow trenches are formed using a low selectivity etch to uniformly etch a deep trench liner oxide, the SOI layer and the electrical isolating material which have interfaces at non-perpendicular angles with respect to the direction of the etching. Once the shallow and deep trenches are formed, subsequent processing including filling the shallow trench, annealing and chemical-mechanical polishing can be performed.

25 Claims, 9 Drawing Sheets

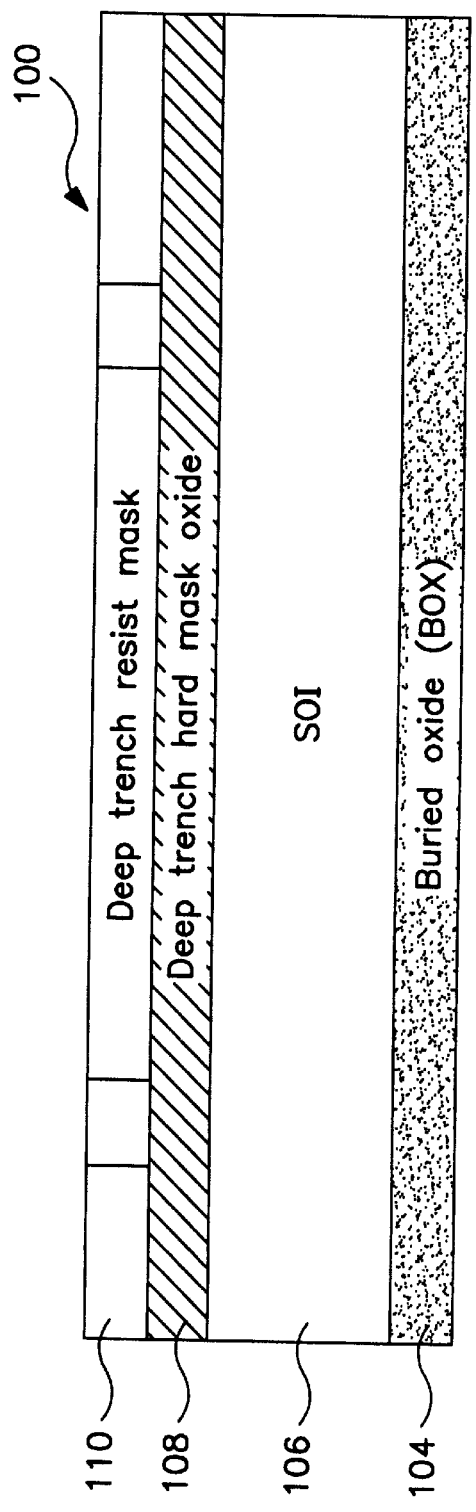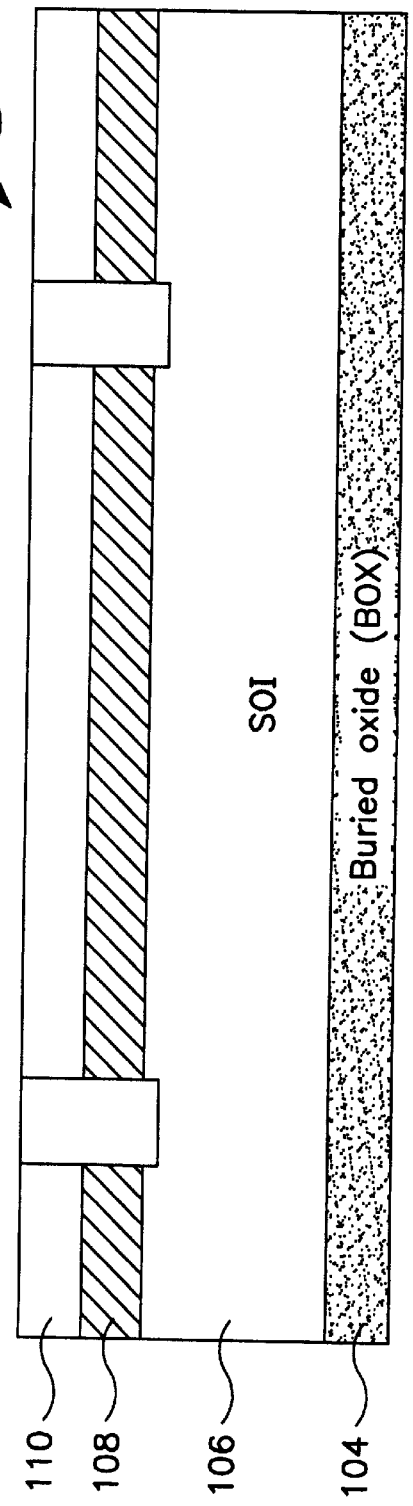
FIG. 2
FIG. 3

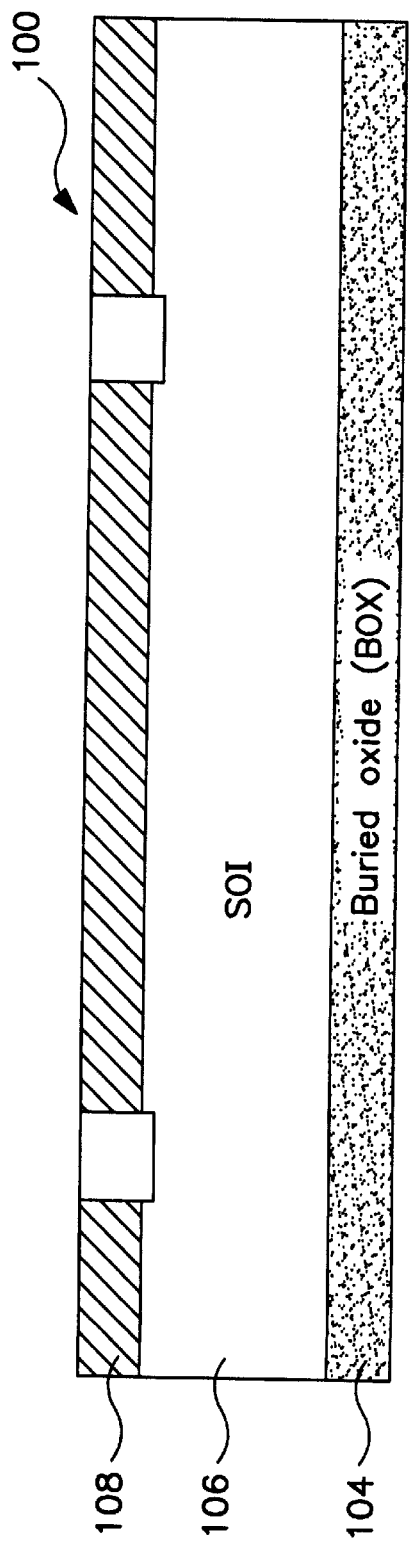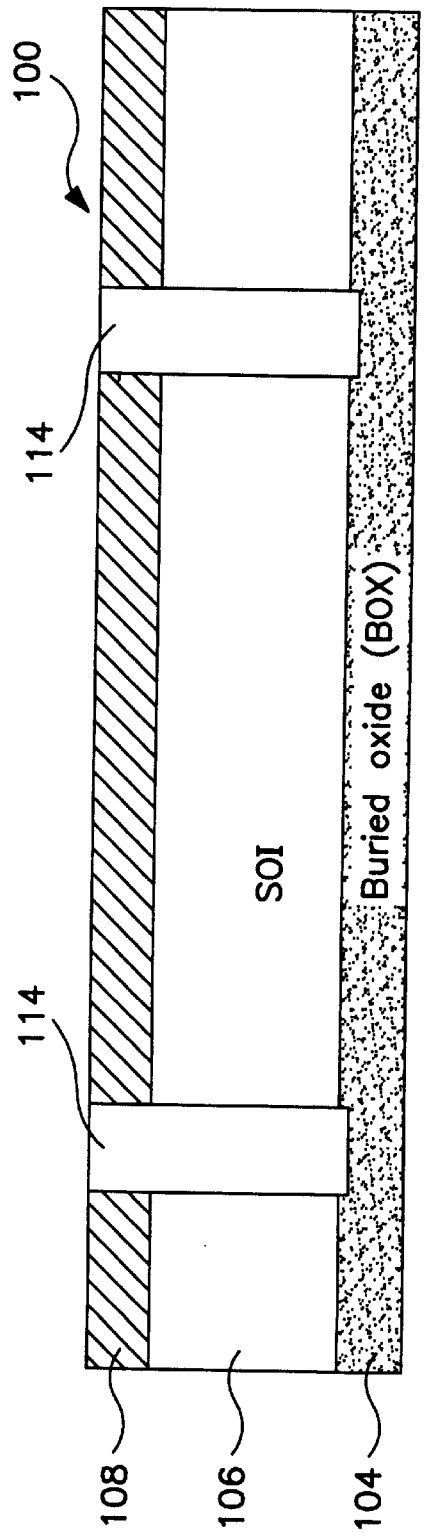

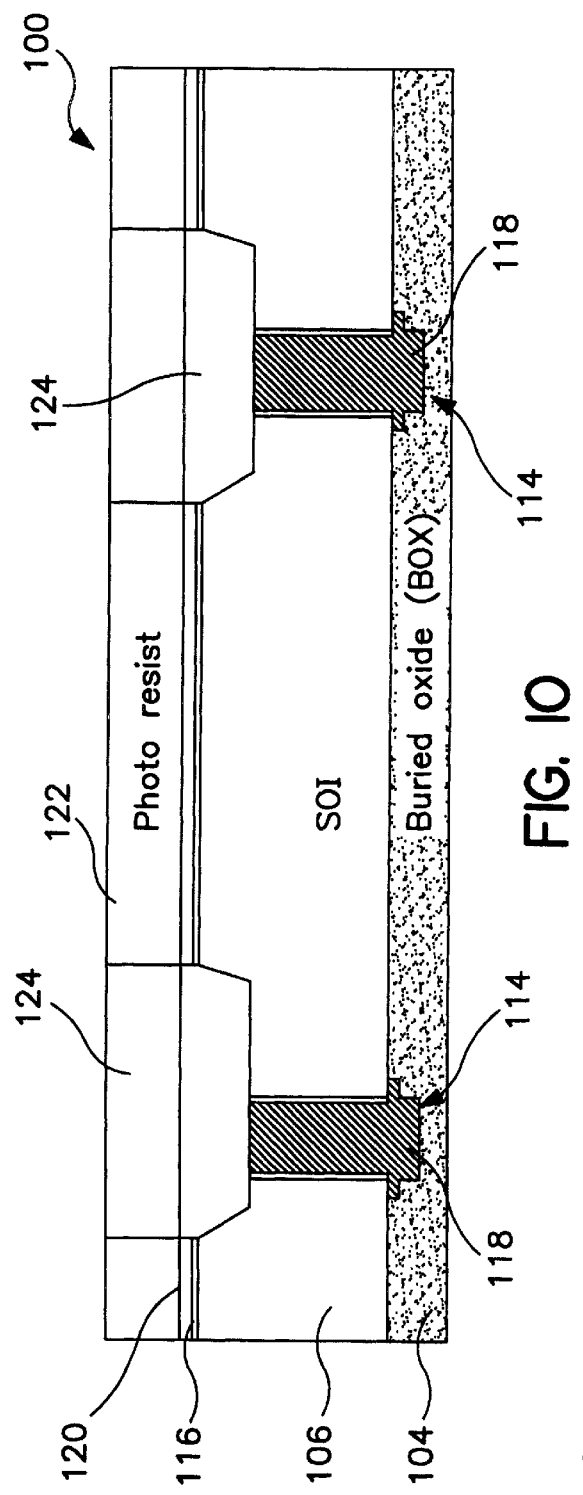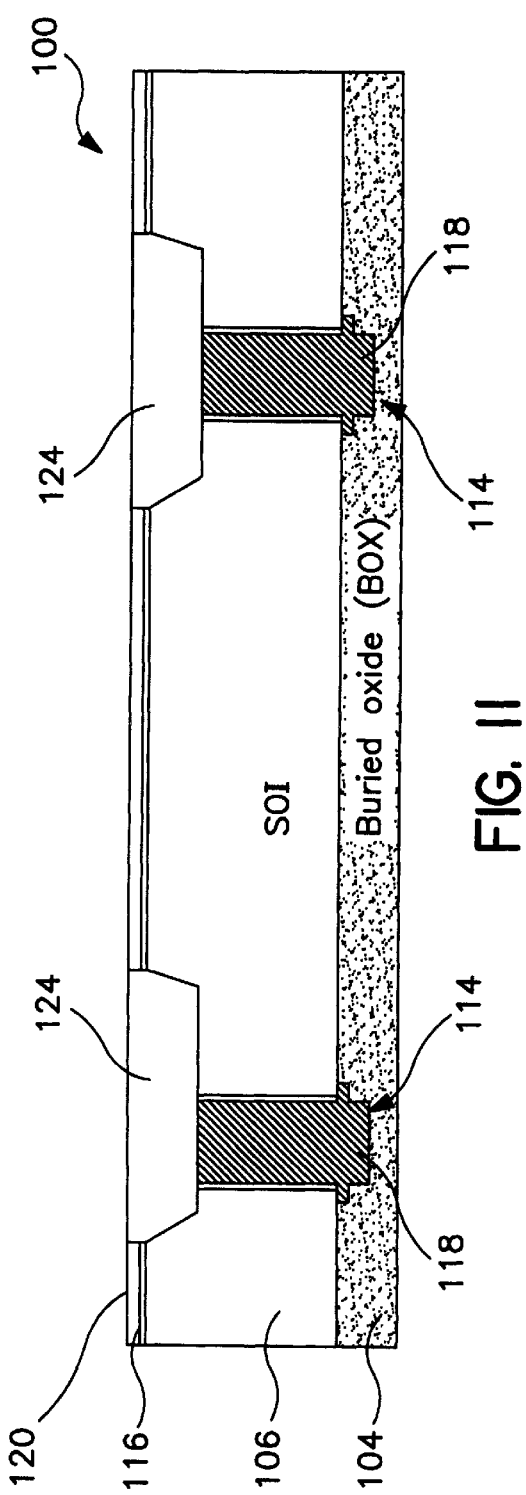

| Step | 1 | 2 | 3 | 4 | 5 | 6 | 7 | 8 |
|---|---|---|---|---|---|---|---|---|
| | St | Bare | St | Nit ME | St | Nit EP | St | Si |
| Pressure (mTorr) | 10 | 10 | 25 | 25 | 40 | 40 | 15 | 15 |
| He_Flow_Thres (sccm) | 30 | 30 | 30 | 30 | 30 | 30 | 30 | 30 |
| RF_Upper (Watt) | 0 | 250 | 0 | 550 | 0 | 550 | 0 | 700 |
| RF_Lower (Watt) | 0 | 40 | 0 | 15 | 0 | 10 | 0 | 90 |
| HBr (sccm) | 0 | 0 | 45 | 45 | 40 | 45 | 20 | 40 |
| $CF_4$ (sccm) | 100 | 100 | 90 | 90 | 160 | 160 | 100 | 80 |
| $CHF_3$ (sccm) | 0 | 0 | 0 | 0 | 0 | 0 | 0 | 0 |
| Gas-09 (Torr) | 6 | 6 | 6 | 6 | 6 | 6 | 6 | 6 |
| Completion | Stabl | EndPt | Stabl | Time | Stabl | EndPt | Stabl | Time |
| Time (seconds) | 10 | 30 | 20 | 70 | 10 | 40 | 10 | 150 |

LAM9400 non-selective etch process.

FIG. 14

| Step number, name | 1, Stab | 2, Nit | 3, Nit OE | 4, Stab | 5, Si | 6, Stab | 7, R |
|---|---|---|---|---|---|---|---|
| Step end control | By Time | Endpoint | 20% of 1 step | 315 | By Time | By Time | 15 |
| Maximum step time (seconds) | 10 | 100 | 30 | 315 | 158 | 10 | 15 |
| Endpoint Selection | No endpoint | Ext endpoint | No endpoint | No endpoint | No endpoint | No endpoint | No endpoint |
| RF Power (Watts) | 0 | 650 | 650 | 0 | 650 | 0 | 500 |
| Pressure (mTorr) | 65 | 65 | 65 | 100 | 100 | 80 | 80 |
| Magnet Field (Gauss) | 0.0 | 0.0 | 0.0 | 30 | 30 | 30 | 30 |
| Helium Pressure (Torr) | 4 | 4 | 4 | 4 | 4 | 4 | 4 |
| Gas Names and Flows (sccm) | $CF_4$ 92 | $CF_4$ 92 | $CF_4$ 92 | HBr 15 | HBr 15 | HBr 60 | HBr 60 |
|  | HBr 10 | HBr 10 | HBr 10 | $CF_4$ 85 | $CF_4$ 85 | $Cl_2$ 20 | $NF_3$ 3 |
|  |  |  |  |  |  | $He-O_2$ 15 | $He-O_2$ 15 |

AMAT MXP non-selective etch process.

FIG. 15

METHOD OF FORMING A SHALLOW AND DEEP TRENCH ISOLATION (SDTI) SUITABLE FOR SILICON ON INSULATOR (SOI) SUBSTRATES

FIELD OF THE INVENTION

The invention relates generally to semiconductor processing, and in particular, to a method of forming a shallow and deep trench isolation (SDTI) suitable for silicon on insulator (SOI) substrates.

BACKGROUND OF THE INVENTION

Electrical isolation between active devices is a requirement for integrated circuits. Electrical isolating structures are formed between active devices to reduce unwanted diffusion of dopants between adjacent devices, to prevent and/or reduce capacitance coupling between adjacent devices, and to prevent latch up (i.e. an unwanted forward biasing of a device from interactions with one or more adjacent devices), to name a few.

Although isolating structures improves the performance and reliability of devices and/or integrated circuits, they typically require a substantial footprint to implement. Since there is a trend to reduce the size of devices and integrated circuits, there is a need to make the size of isolating structures as minimal as possible. One existing isolating structure is an oxide formed by local oxidation of silicon (LOCOS). An undesirable characteristic of LOCOS is that it typically requires a relatively large footprint to properly implement it.

An additional problem with existing isolating structures is that they typically produce a non-planarized top surface in the process of forming these structures. A non-planarized top surface is not desired because subsequent processing on a non-planarized top surface is more difficult than on a planarized surface. Otherwise, an undesirable planarization step is required before subsequent processing is performed. The isolating oxide formed by LOCOS typically results in a non-planarized top surface.

Yet, another problem with existing isolating structures is that they typically have adverse effects due to high temperature processes required to form them. As a result, unwanted diffusion of dopants may occur from the high temperature processes. Additionally, unwanted stresses may form between the isolating structures and other adjacent materials. An example of the effect of a known source of stress in existing isolating structure is the stress caused by the formation of the "bird's beak" at the interface of the LOCOS and adjacent nitride layers.

Thus, there is a need for a method of forming an electrical isolating structure that requires a relatively smaller footprint to implement, that results in a more planarized top surface, that is less susceptible to outgassing and unwanted diffusion, and that produces less stress against adjacent materials. In particular, an improved method of forming a shallow and deep trench isolation is provided herein that reduces or eliminates the problems associated with existing electrical isolating structures for devices and/or integrated circuits.

SUMMARY OF THE INVENTION

One aspect of the invention includes a method of forming a shallow-deep trench isolation (SDTI) suitable for silicon on insulator (SOI) wafers that includes the steps of forming deep trenches through a silicon on insulator (SOI) layer without substantially disturbing an underlying buried oxide (BOX) layer. Once the deep trenches are formed, the trenches are filed with suitable electrical isolating materials, such as undoped polysilicon or dielectric material, and etched back to obtain a substantially planarized top surface. Subsequently, an active nitride layer is deposited on the planarized top surface, and then shallow trenches are formed. The shallow trenches are formed using a low selectivity etch to uniformly etch a deep trench liner oxide, the active nitride and underlying oxide layers, SOI layer and the electrical isolating material which have interfaces at non-perpendicular angles with respect to the direction of the etch. Once the shallow and deep trenches are formed, subsequent processing including filling the shallow trench, annealing and chemical-mechanical polishing can be performed.

More specifically, a method of forming a shallow and deep trench isolation in a silicon on insulator (SOI) wafer is provided as an aspect of the invention. The SOI wafer comprises a silicon on insulator (SOI) layer disposed on a buried oxide layer which is, in turn, disposed on a handle wafer. The method comprises the steps of forming a layer of a hard mask oxide on the top surface of the SOI layer, and then forming at least one window through the mask oxide layer to expose the underlying SOI layer. Then, a deep trench is formed through the SOI layer down to the buried oxide layer by removing a portion of the SOI layer underlying the window of the mask oxide layer. Then, the hard mask oxide is removed using an etching process that is characterized by a relatively high etching ratio of the hard mask oxide to the buried oxide layer. The removal of the hard mask oxide thereby minimizes the etching of the buried oxide layer.

Following the removal of the hard mask oxide, a liner oxide material is formed on the sidewall of the deep trench and the wafer surface. Then, the deep trench is filled with an electrical isolating material such as a doped or undoped glass (dielectric) or an undoped polysilicon. The electrical isolating material is then etched back to remove the material above the SOI layer and substantially planarize the top surface of the SOI wafer at this point of the process. Following the etch back procedure, an active area pad oxide and nitride layers are deposited over the SOI layer and then a shallow trench is formed over the deep trench by removing portions of the active area layer, the SOI layer, the deep trench liner oxide, and the electrical isolating material. Because the interfaces of the SOI layer, the deep trench liner oxide, and the electrical isolating material are at non-perpendicular angles with respect to the direction of the etching during the shallow trench formation, a low selectivity etching process is used so that the etching rates of these materials are substantially the same. This forms a substantially planarized shallow trench floor. Once the shallow trench is formed, it is filled with an electrical isolating material.

This method of the invention has several advantages over the prior art methods of forming isolating structures for active devices. First, the method of the invention forms the shallow-deep trench isolation (SDTI) with a substantially planarized top surface. This makes subsequent processes easier to perform because of the planarized top surface, and also helps in the planarization of the final product. Second, since the method does not use a local oxidation of silicon (LOCOS) which typically requires a relatively large footprint, much smaller dimensions for the devices and/or integrated circuits can be formed using the method of forming a shallow-deep trench isolation (SDTI) in accordance with the invention. Third, since the deep trench fill material is buried and encapsulated by the overlying shallow trench fill, outgassing and unwanted diffusion of the deep trench fill material is reduced. This allows the use of such low stress materials as a heavily doped BPSG glass.

BRIEF DESCRIPTION OF THE DRAWINGS

FIG. 2 illustrates the exemplary silicon on insulator (SOI) wafer after undergoing a deep trench hard mask oxide formation step in the exemplary method of forming a shallow-deep trench isolation (SDTI) in accordance with the invention;

FIG. 3 illustrates the exemplary silicon on insulator (SOI) wafer after undergoing an etching of the deep trench hard mask oxide formation step in the exemplary method of forming a shallow-deep trench isolation (SDTI) in accordance with the invention;

FIG. 4 illustrates the exemplary silicon on insulator (SOI) wafer after undergoing a deep trench hard mask oxide resist strip in the exemplary method of forming a shallow-deep trench isolation (SDTI) in accordance with the invention;

FIG. 5 illustrates the exemplary silicon on insulator (SOI) wafer after undergoing a deep trench formation step in the exemplary method of forming a shallow-deep trench isolation (SDTI) in accordance with the invention;

FIG. 10 illustrates the exemplary silicon on insulator (SOI) wafer after undergoing a low selectivity shallow trench etch step in the exemplary method of forming a shallow-deep trench isolation (SDTI) in accordance with the invention;

FIG. 11 illustrates the exemplary silicon on insulator (SOI) wafer after undergoing photo resist strip and clean step in the exemplary method of forming a shallow-deep trench isolation (SDTI) in accordance with the invention;

FIG. 14 illustrates a table depicting an exemplary list of the steps and parameters for a LAM9400 model plasma etch apparatus manufactured by LAM Research Corporation used to achieve a low selectivity etch of various materials to form a shallow trench in accordance with the invention; and FIG. 15 illustrates a table depicting an exemplary list of the steps and parameters for an AMAT MXP model plasma etch apparatus manufactured by Applied Materials Corporation used to achieve a low selectivity etch of various materials to form a shallow trench in accordance with the invention.

DETAILED DESCRIPTION OF THE INVENTION

I. Method of Forming a Shallow-Deep Trench Isolation (SDTI)

Figure 1:
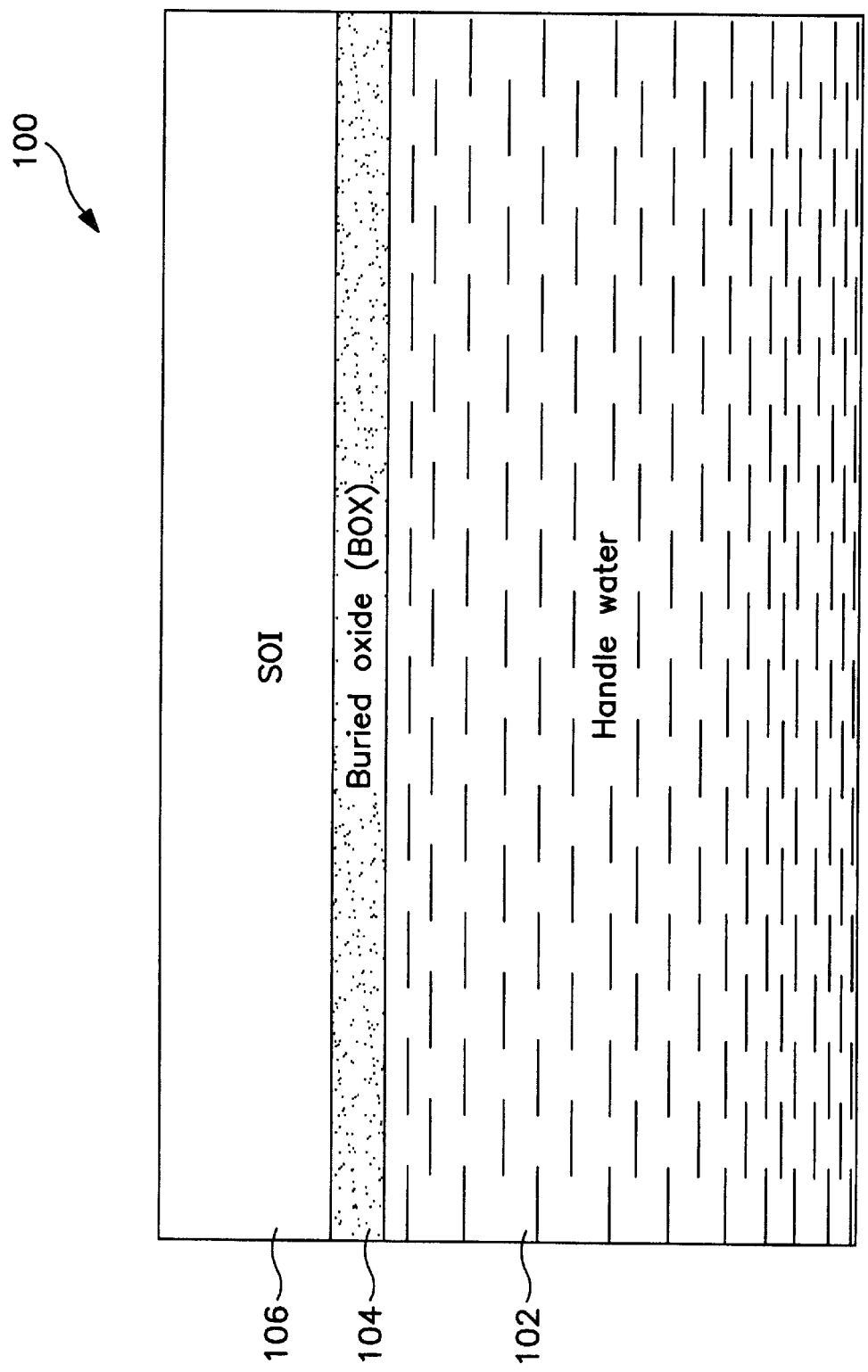
FIG. 1 illustrates a side sectional view of an exemplary silicon on insulator (SOI) wafer as a starting material for an exemplary method of forming a shallow-deep trench isolation (SDTI) in accordance with the invention.

FIG. 1 illustrates a side sectional view of an exemplary silicon on insulator (SOI) wafer 100 as a starting material for an exemplary method of forming a shallow-deep trench isolation (SDTI) in accordance with the invention. The SOI wafer 100 comprises a handle wafer 102, a buried oxide (BOX) layer 104 disposed on the handle wafer 102, and a silicon on insulator (SOI) layer 106 disposed on the buried oxide (BOX) layer 104.

In summary, a first part of the method of forming a shallow-deep trench isolation (SDTI) in accordance with the invention is to form deep trenches through the silicon on insulator (SOI) layer 106 without substantially disturbing the underlying buried oxide (BOX) layer 104. Once the deep trenches are formed, the trenches are lined with a suitable dielectric material and later filled with suitable electrical isolating materials, such as poly-silicon or a dielectric material, and etched back to obtain a substantially planarized top surface. The liner material is selected in such a way as to act as an etch stop during the fill etchback. Then, an active nitride layer is deposited on the top surface, and then a pair of shallow trenches are formed. The shallow trenches are formed using a low selectivity etch to uniformly etch the deep trench fill material, the deep trench liner oxide, and the silicon on insulator (SOI) layer 106 which have interfaces at non-perpendicular angles with respect to the direction of the etching. Once the shallow and deep trenches are formed, subsequent processing including filling the shallow trench, annealing and chemical mechanical polishing can be performed.

FIG. 2 illustrates the exemplary silicon on insulator (SOI) wafer 100 after undergoing an initial step in the method of forming a shallow-deep trench isolation (SDTI) in accordance with the invention. In the initial step, a layer of a hard mask oxide 108 serving as a mask for the deep trench etching is deposited on the silicon on insulator (SOI) layer 106. Preferably, the hard mask oxide 108 may comprise an oxide deposited by plasma-enhanced chemical vapor deposition (PECVD-TEOS) and/or sub-atmospheric undoped silicon glass (SA-USG) Also, it is preferred that the hard mask oxide 108 is not densified at high temperature in order to preserve its high chemical etch rate ratio to thermal oxide. After forming the hard mask oxide 108, a layer of resist 110 is deposited on the hard mask oxide 108, and developed for etching of the deep trenches.

FIG. 3 illustrates the exemplary silicon on insulator (SOI) wafer 100 after undergoing a subsequent step in the method of forming a shallow-deep trench isolation (SDTI) in accordance with the invention. In this step, the hard mask oxide 108 is patterned to form windows in the hard mask oxide 108 through which the deep trenches are subsequently formed. In the preferred implementation of the method, the hard mask oxide 108 is etched anisotropically in plasma.

FIG. 4 illustrates the exemplary silicon on insulator (SOI) wafer 100 after undergoing a subsequent step in the method of forming a shallow-deep trench isolation (SDTI) in accordance with the invention. In this step, the deep trench mask resist 110 is removed. Thus, the silicon on insulator (SOI) wafer 100 is now in condition for etching of the deep trenches.

FIG. 5 illustrates the exemplary silicon on insulator (SOI) wafer 100 after undergoing a subsequent step in the method of forming a shallow-deep trench isolation (SDTI) in accordance with the invention. In this step, an etching of the silicon on insulator (SOI) layer 106 is performed through the windows of the hard mask oxide 108 to form the deep trenches 114. In the preferred implementation of the method, the silicon on insulator (SOI) layer 106 is etched anisotropically, with high selectivity to oxide.

Figure 6:
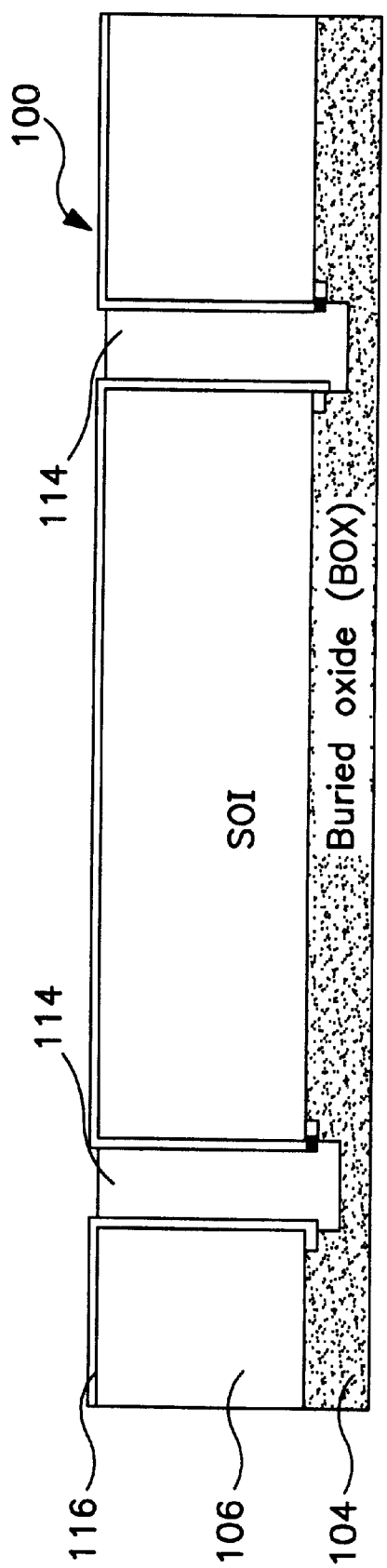
FIG. 6 illustrates the exemplary silicon on insulator (SOI) wafer after undergoing a wet deep trench hard mask oxide strip and deep trench liner formation steps in the exemplary method of forming a shallow-deep trench isolation (SDTI) in accordance with the invention.

FIG. 6 illustrates the exemplary silicon on insulator (SOI) wafer 100 after undergoing a subsequent step in the method of forming a shallow-deep trench isolation (SDTI) in accordance with the invention. In this step, the hard mask oxide 106 is removed along with polymers that may be present on the sidewalls of the deep trenches 114. In the preferred implementation of the method, the hard mask oxide 108 has a high etch ratio to the buried oxide (BOX) layer 104 so that removing the hard mask oxide does not substantially affect the underlying buried oxide (BOX) layer 104. In the preferred implementation of the method, the hard mask oxide 106 is removed by a hydrofluoric (HF) etching solution. The removal of the hard mask oxide 106 may cause some further etching of the buried oxide (BOX) layer 104 as well as some undercutting of the silicon on insulator (SOI) layer 106. Additionally, a thin layer of oxide or oxide/nitride layer 116 is formed along the walls of the deep trenches 114 and on the top surface of the silicon on insulator (SOI) layer 106. The liner oxide or oxide/nitride 116 serves to isolate the fill material from silicon and as an etch stop during the subsequent fill etch back.

Figure 7:
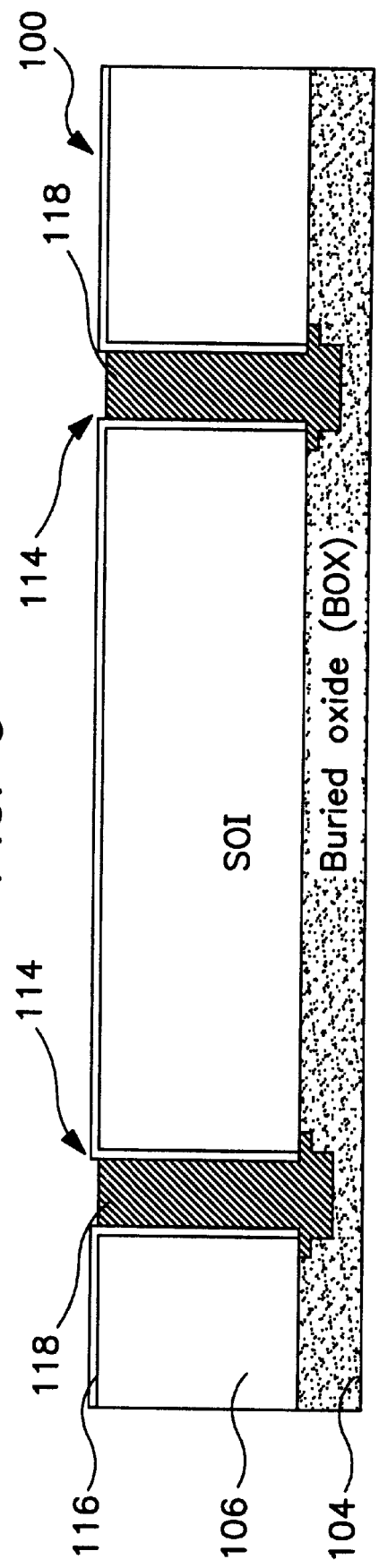
FIG. 7 illustrates the exemplary silicon on insulator (SOI) wafer after undergoing a deep trench fill and etch back steps in the exemplary method of forming a shallow-deep trench isolation (SDTI) in accordance with the invention.

FIG. 7 illustrates the exemplary silicon on insulator (SOI) wafer 100 after undergoing a subsequent step in the method of forming a shallow-deep trench isolation (SDTI) in accordance with the invention. In this step, electrical isolating material 118 is deposited to fill the deep trenches 114. Some of the electrical isolating material 118 will also be deposited above the silicon on insulator (SOI) layer 106. In the preferred implementation of the method, the electrical isolating material 118 comprises either a dielectric material or undoped poly-silicon. Once the deep trenches 114 are filled with the electrical isolating material 118, an etch back is performed to remove excess electrical isolating material 118 above the silicon on insulator (SOI) layer 106 and to substantially planarize the top surface of the silicon on insulator (SOI) wafer 100.

Figure 8:
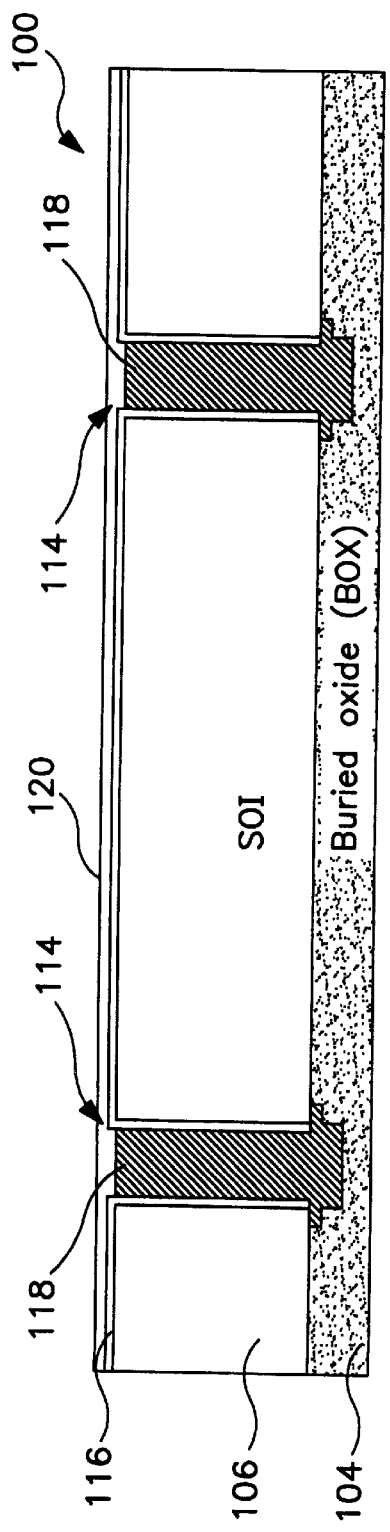
FIG. 8 illustrates the exemplary silicon on insulator (SOI) wafer after undergoing an active area nitride deposition step in the exemplary method of forming a shallow-deep trench isolation (SDTI) in accordance with the invention.

FIG. 8 illustrates the exemplary silicon on insulator (SOI) wafer 100 after undergoing a subsequent step in the method of forming a shallow-deep trench isolation (SDTI) in accordance with the invention. In this step, an active area nitride layer 120 is deposited over the top surface of the silicon on insulator (SOI) layer 106, and specifically on the liner oxide or oxide/nitride layer 116 and on the top surface of the electrical isolating filling material 1 18. The nitride layer 120 is part of the active layers used for the subsequently formed active device.

Figure 9:
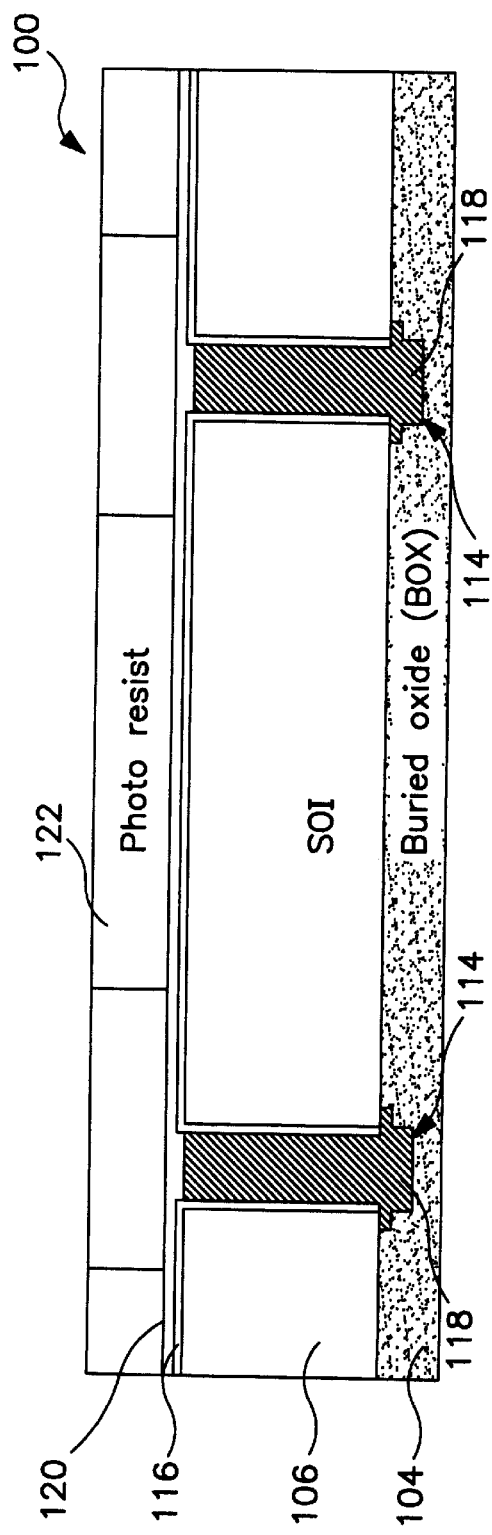
FIG. 9 illustrates the exemplary silicon on insulator (SOI) wafer after undergoing an active area patterning step in the exemplary method of forming a shallow-deep trench isolation (SDTI) in accordance with the invention.

FIG. 9 illustrates the exemplary silicon on insulator (SOI) wafer 100 after undergoing a subsequent step in the method of forming a shallow-deep trench isolation (SDTI) in accordance with the invention. In this step, a layer of photo resist 122 is deposited on the active nitride layer 120 for the purpose of patterning the layer 120. The resist 122 is developed with a pattern that will subsequently form the shallow trenches for the silicon on insulator (SOI) wafer 100.

FIG. 10 illustrates the exemplary silicon on insulator (SOI) wafer 100 after undergoing a subsequent step in the method of forming a shallow-deep trench isolation (SDTI) in accordance with the invention. In this step, shallow trenches 124 are formed over the deep trenches 114. In the preferred implementation of the method, a low selectivity material etch is performed in forming the shallow trenches 124.

The reason for the low selectivity material etch is that there are several dissimilar material layers that have interfaces oriented in non-perpendicular angles with respect to the direction of the etch flow (which in this case is downward). These dissimilar materials possibly include the spin-on bottom anti-reflective coating (BARC), deposited prior to photo resist 122 deposition and patterning, the liner oxide or oxide/nitride layer 116, and the electrical isolating deep trench fill material 118. In the preferred implementation of the method, the low selectivity material etch is performed in accordance with U.S. Patent Application entitled "Method of Low-Selective Etching of Dissimilar Materials Having Interfaces at Non-Perpendicular Angles to the Etch Propagation Direction," filed concurrently with this application, and which is incorporated herein by reference. The details of the low-selectivity etching is also described below.

FIG. 11 illustrates the exemplary silicon on insulator (SOI) wafer 100 after undergoing a subsequent step in the method of forming a shallow-deep trench isolation (SDTI) in accordance with the invention. In this step, the photo resist 122 is removed, and the top surface of the silicon on insulator (SOI) wafer 100 is cleaned. The shallow trench 124 is now in condition to be filled with an electrical isolating material such as a dielectric or undoped poly-silicon, and the silicon on insulator wafer 100 can undergo further processing including annealing, chemical mechanical polishing, forming of the active device, and/or other desired processes.

This method of the invention has several advantages over the prior art methods of forming isolating structures for active devices. First, the method of the invention forms the shallow-deep trench isolation (SDTI) with a substantially planarized top surface. This makes subsequent processes easier to perform because of the planarized top surface, and also helps in the overall planarization of the final product. Second, since the method does not use a local oxidation of silicon (LOCOS) which typical requires a relatively large footprint, much smaller dimensions for the devices and/or integrated circuits can be formed using the method of forming a shallow-deep trench isolation (SDTI) in accordance with the invention. Third, since the deep trench fill material is buried and encapsulated by the overlying shallow trench fill, outgassing and unwanted diffusion of the deep trench fill material are reduced.

II. Low-Selectivity Etching

The method of forming a shallow-deep trench isolation (SDTI) of the invention includes as a step a method of low-selective etching dissimilar materials having interfaces at non-perpendicular angles to the direction of the etch propagation in order to achieve an improved planarized etched surface. The etching method of the invention is particularly appropriate for etching by a plasma etch apparatus. In a plasma etch, a primary factor affecting the etch rate of a particular material is the process gas composition. For example, hydrogen bromide (HBr) and chlorine ($CL_2$) gasses typically define the etching rate of mono- and poly-crystalline silicon, whereas tri-fluoro methane ($CHF_3$) and di-fluoro methane ($CH_2F_2$) typically reduces the etching rates of mono- and poly- crystalline silicon. Also, for example, methane ($CF_4$) gas typically defines the etching rates for oxides and nitrides, whereas oxygen ($O_2$) typically reduces the etching rates of oxides and nitrides.

Besides the gas composition mixture as being a primary factor in determining the etching rates for various semiconductor process materials, there are secondary factors that also affect the etching rates of these materials. For instance, the plasma power setting, the process pressure, the helium (He) pressure on the backside of the wafer, and the wafer temperature to name a few. Although not a primary factor in determining the etching rates of semiconductor process materials, these secondary factors can be used to "fine tune" the method of simultaneously etching dissimilar materials to achieve a substantially low selectivity etch to improve planarization of the etched surface.

Using the above principles, the method of achieving a substantially low-selectivity etching of dissimilar materials having interfaces at non-perpendicular angles to the direction of the etch propagation typically comprises introducing a particular process gas mixture (primary factor) along with establishing particular process settings (secondary factor) so that the respective etching rates of the dissimilar materials are substantially the same, i.e. a substantially low-selective etching process. A simplified example of the method is provided below, and a more detailed example of the method will be provided further in the disclosure. These are merely examples, and the scope of the invention shall not be limited to these examples, but should encompass the broad teachings of the invention.

Figure 12:
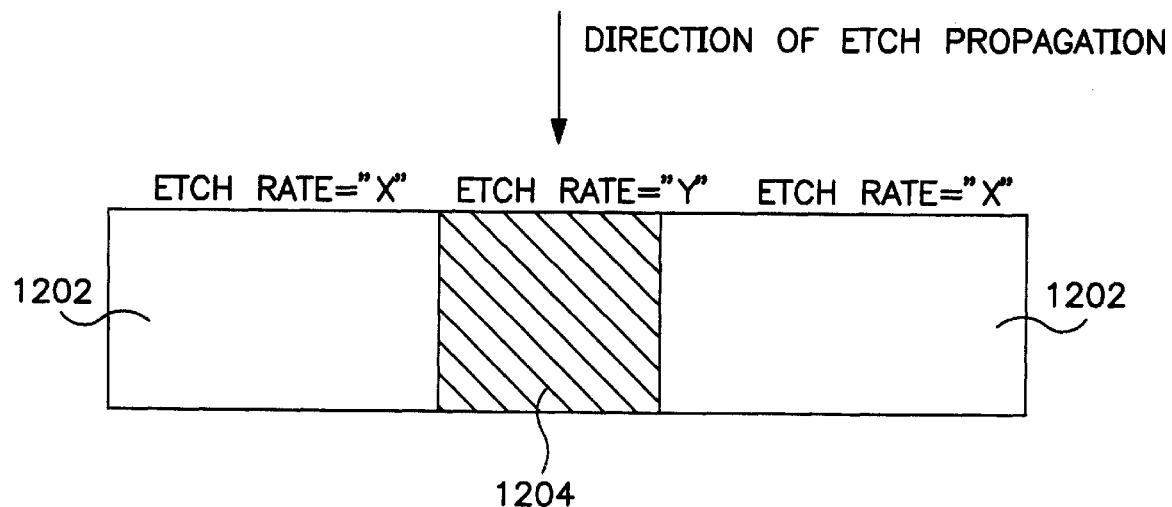
FIG. 12 illustrates a sectional view of two dissimilar semiconductor process materials having interfaces at a non-perpendicular angle with respect to the direction of the etch propagation, as indicated by the arrow.

FIG. 12 illustrates a sectional view of two dissimilar semiconductor process materials 1202 and 1204 having interfaces at a non-perpendicular angle with respect to the direction of the etch propagation, as indicated by the arrow. Although in this example, the interfaces of the materials 1202 and 1204 are substantially parallel to the direction of etch propagation, it shall be understood that the method of the invention covers other angles other than substantially perpendicular angles to the direction of etch propagation. In this example, material 1202 consists of a mono-crystalline silicon and material 1204 consists of an oxide.

In this example, assume that for a given process setting, the etch rate of the monocrystalline silicon 1202 using hydrogen bromide (HBr) gas as an etchant is "X", and the etch rate of the oxide 1204 using methane ($CF_4$) gas as an etchant is "Y." Thus, the process gas mixture for performing a substantially low-selective etching of materials 1202 and 1204 will comprise at least a mixture of hydrogen bromide (HBr) and methane ($CF_4$), because these are gasses that dominate the etching of these respective materials. Also assume, for this example, that the etch rate "X" of the mono-crystalline silicon 1202 is greater than the etch rate "Y" of the oxide 1204. In this example, it may be desirable to introduce to the process gas mixture, an additional gas that would reduce the etch rate "X" of the mono-crystalline 1202 so that it etches at substantially the same etch rate "Y" of the oxide 1204. Such a gas may include tri-fluoro methane ($CHF_3$) or di-fluoro methane ($CH_2F_2$), which typically reduces the etching rates of mono- and poly- crystalline silicon. Thus, the process gas mixture in this example would include hydrogen bromide (HBr) and methane ($CF_4$) and tri-fluoro methane ($CHF_3$) or di-fluoro methane ($CH_2F_2$).

This example illustrates the concept of the invention of arriving at a process gas mixture that achieves a substantially low selectivity etching of dissimilar materials having interfaces that are at non-perpendicular angles with respect to the direction of etch propagation. By including a specific mixture of etch promoting and suppressing gases, simultaneous and low-selectivity etching of dissimilar materials may be achieved. Additionally, the parameters of the plasma etching apparatus may be configured, in addition to providing a specific mixture of the process gas, in order to fine tune the process so that substantially the same etch rate can be achieved for the dissimilar materials. A more specific example of the method of the invention is described below.

Figure 13:
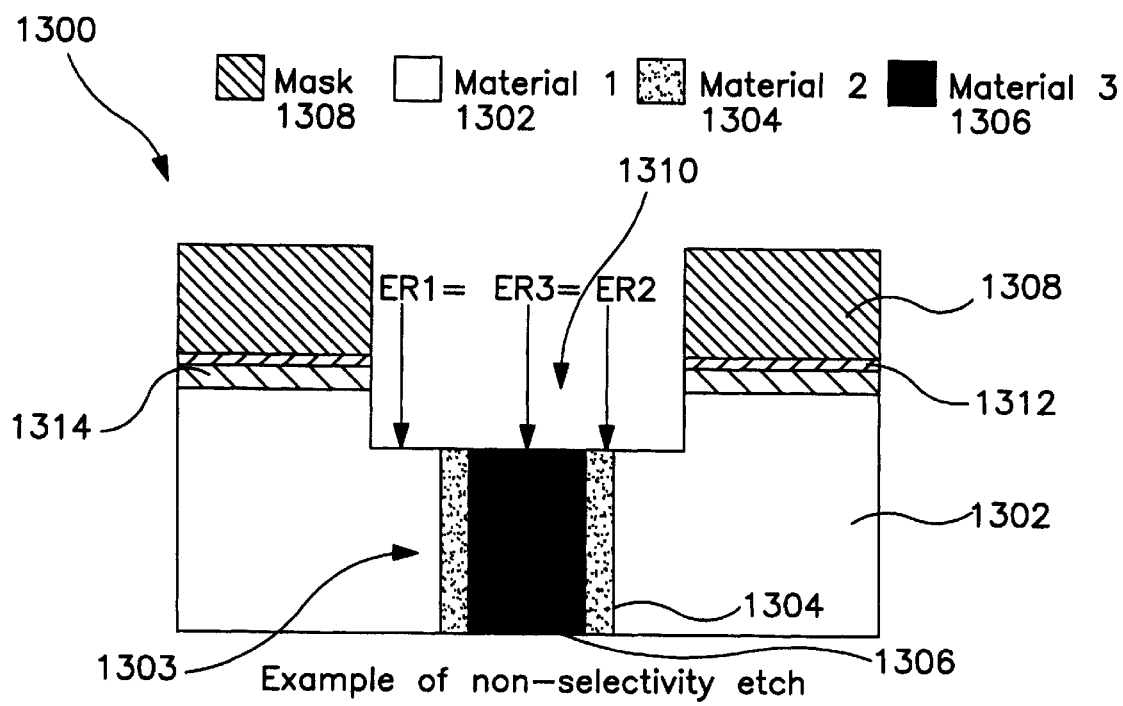
FIG. 13 illustrates a sectional view of a portion of an exemplary silicon on insulator (SOI) wafer in which a shallow and deep trench isolations has been formed in accordance with the method of the invention.

FIG. 13 illustrates a sectional view of a portion of an exemplary silicon on insulator (SOI) wafer 1300 in which a shallow and deep trench isolations has been formed in accordance with the method of the invention. The SOI wafer 1300 comprises a mono-crystalline silicon layer 1302 having a deep trench isolation 1303 comprising a thermal silicon oxide 1304 and a poly-crystalline silicon 1306. The SOI wafer 1300 further includes a photo resist mask layer 1308, a Bottom Antireflective Coating (BARC) 1312, and an active area nitride layer 1314 with an opening that has been etched along with the mono-crystalline silicon layer 1302, the thermal silicon oxide 1304 and the poly-crystalline silicon 1306 to form the shallow trench 1310 with the substantially low selective etch in accordance with the invention.

FIG. 14 illustrates a table depicting an exemplary list of the steps and parameters for a LAM9400 model plasma etch apparatus manufactured by LAM Research Corporation used to achieve a low selectivity etch of various materials to form a shallow trench in accordance with the invention. In the preferred implementation of the method, there are eight (8) steps in the method of forming the shallow trench 1310, as listed in the top horizontal entries of the table. The first seven (7) steps are preparation steps, including the etching of the Bottom Antireflective Coating (BARC) 1312 and the active area nitride 1314, performed prior to the low selectivity etch of the method of the invention, which is performed in step eight (8).

Step one (1) of the method of forming the shallow trench 1310 is a stability step (St). Stability steps are typically performed each time the environment in the plasma etching chamber has changed to allow the environment to stabilize prior to initiation of the next step. In this case, the plasma etch environment is being changed from a "turn off" environment to an etching of a Bottom Antireflective Coating (BARC) environment as specified in step two (2).

In stability step one (1), the gas plasma pressure is set to 10 mTorr, the Helium Flow Threshold (i.e. maximum flow rate for the Helium gas on the backside of the wafer) abbreviated He_Flow_Thres is set to 30 sccm, the radio frequency (RF) power on the upper electrode abbreviated RF_Upper is set to zero (0) Watt, the RF power on the lower electrode abbreviated RF_Lower is set to zero (0) Watt, the flow rate for the hydrogen bromide (HBr) process gas is set to zero (0) sccm, the flow rate for the methane ($CF_4$) process gas is set to 100 sccm, the flow rate for the tri-fluoro methane ($CHF_3$) process gas is set to zero (0) sccm, the pressure of the Helium gas on the backside of the wafer abbreviated as Gas-09 is set to six (6) Torr, the completion of the step is based on when the process environment stabilizes (abbreviated "Stabl"), and the maximum time for completion of the step is set to ten (10) seconds, which causes an alarm to sound if the process takes more than the maximum time.

Step two (2) of the method of forming the shallow trench 1310 is a step of etching the Bottom Antireflective Coating (BARC) 1312, which has been deposited over the active area nitride area 1314. In this step, the gas plasma pressure is set to 10 mTorr, the Helium Flow Threshold is set to 30 sccm, the RF power on the upper electrode is set to 250 Watts, the RF power on the lower electrode is set to 40 Watts, the flow rate of the hydrogen bromide (HBr) process gas is set to zero (0) sccm, the flow rate of the methane (CF$_4$) process gas is set to 100 sccm, the flow rate of the tri-fluoro methane (CHF$_3$) process gas is set to zero (0) sccm, the pressure of the Helium gas (Gas-09) on the backside of the wafer is set to six (6) Torr, the completion of the step is based on when an endpoint detection has occurred signifying that the Bottom Antireflective Coating (BARC) layer 1312 has been substantially removed (abbreviated "Endpt"), and the maximum time for completion of the step is set to 30 seconds.

Step three (3) of the method of forming the shallow trench 1310 is another stability step (St). In this case, the plasma etch environment is being changed from the etching of the Bottom Antireflective Coating (BARC) environment as specified in step two (2) to an etching of an active area nitride layer environment specified in step four (4). In step three (3), the gas plasma pressure is set to 25 mTorr, the Helium Flow Threshold is set to 30 sccm, the RF power on the upper electrode is set to zero (0) Watt, the RF power on the lower electrode is set to zero (0) Watt, the flow rate of the hydrogen bromide (HBr) process gas is set to 45 sccm, the flow rate of the methane (CF$_4$) process gas is set to 90 sccm, the flow rate of the tri-fluoro methane (CHF$_3$) process gas is set to zero (0) sccm, the pressure of the Helium gas (Gas-09) on the backside of the wafer is set to six (6) Torr, the completion of the step is based on when the process environment stabilizes, and the maximum time for completion of the step is set to 20 seconds.

Step four (4) of the method of forming the shallow trench 1310 is a step of etching the active area nitride layer 1314 in the process of forming the shallow trench 1310. In this step, the gas plasma pressure is set to 25 mTorr, the Helium Flow Threshold is set to 30 sccm, the RF power on the upper electrode is set to 550 Watts, the RF power on the lower electrode is set to 15 Watts, the flow rate of the hydrogen bromide (HBr) process gas is set to 45 sccm, the flow rate of the methane (CF$_4$) process gas is set to 90 sccm, the flow rate of the tri-fluoro methane (CHF$_3$) process gas is set to zero (0) sccm, the pressure of the Helium gas (Gas-09) on the backside of the wafer is set to six (6) Torr, the completion of the step is based on a time of 70 seconds.

Step five (5) of the method of forming the shallow trench 1310 is another stability step (St). In this case, the plasma etch environment is being changed from the etching of active area nitride layer environment as specified in step four (4) to the end-point etching of the active area nitride step as specified in step 6. In step five (5), the gas plasma pressure is set to 40 mTorr, the Helium Flow Threshold is set to 30 sccm, the RF power on the upper electrode is set to zero (0) Watt, the RF power on the lower electrode is set to zero (0) Watt, the flow rate of the hydrogen bromide (HBr) process gas is set to 40 sccm, the flow rate of the methane (CF$_4$) process gas is set to 160 sccm, the flow rate of the trifluoro methane (CHF$_3$) process gas is set to zero (0) sccm, the pressure of the Helium gas (Gas-09) on the backside of the wafer is set to six (6) Torr, the completion of the step is based on when the process environment becomes substantially stable, and the maximum time for completion of the step is set to 10 seconds.

Step six (6) of the method of forming the shallow trench 1310 is a step of etching the active area nitride layer until an endpoint has been detected, in the process of forming the shallow trench 1310. In this step, the gas plasma pressure is set to 40 mTorr, the Helium Flow Threshold is set to 30 sccm, the RF power on the upper electrode is set to 550 Watts, the RF power on the lower electrode is set to 10 Watts, the flow rate of the hydrogen bromide (HBr) process gas is set to 45 sccm, the flow rate of the methane (CF$_4$) process gas is set to 160 sccm, the flow rate of the tri-fluoro methane (CHF$_3$) process gas is set to zero (0) sccm, the pressure of the Helium gas (Gas-09) on the backside of the wafer is set to six (6) Torr, the completion of the step is based on an endpoint detection, and the maximum time for completion of the step is set to 40 seconds.

Step seven (7) of the method of forming the shallow trench 1310 is another stability step (St). In this case, the plasma etch environment is being changed from the endpoint etching of active area nitride layer environment as specified in step six (6) to the substantially low selective etching of the mono-crystalline silicon layer 1302, the thermal silicon oxide 1304 and the poly-crystalline silicon 1306 as specified in step eight (8). In step seven (7), the gas plasma pressure is set to 15 mTorr, the Helium Flow Threshold is set to 30 sccm, the RF power on the upper electrode is set to zero (0) Watt, the RF power on the lower electrode is set to zero (0) Watt, the flow rate of the hydrogen bromide (HBr) process gas is set to 20 sccm, the flow rate of the methane (CF$_4$) process gas is set to 100 sccm, the flow rate of the tri-fluoro methane (CHF$_3$) process gas is set to zero (0) sccm, the pressure of the Helium gas (Gas-09) on the backside of the wafer is set to six (6) Torr, the completion of the step is based on when the process environment becomes substantially stable, and the maximum time for completion of the step is set to 10 seconds.

Step eight (8) of the method of forming the shallow trench 1310 is the etching of the mono-crystalline silicon layer 1302, the thermal silicon oxide 1304 and the poly-crystalline silicon 1306. This is performed with the substantially low selective etching method of the invention. The objective here is to etch the mono-crystalline silicon layer 1302, the thermal silicon oxide 1304 and the poly-crystalline silicon 1306 such that their etch rates are substantially the same. Thus, as a result of the substantially low selective etch process of the invention, a substantially planarized bottom surface of the shallow trench 1310 is formed.

The flow rates, among other parameters of the LAM9400, for the active process gases (i.e. hydrogen bromide (HBr), methane (CF$_4$), and tri-fluoro methane (CHF$_3$)) are selected to achieve substantially the same etch rates for the mono-crystalline silicon layer 1302, the thermal silicon oxide 1304, and the poly-crystalline silicon 1306. As previously discussed, hydrogen bromide (HBr) is the primary etchant for the mono- and poly-crystalline silicon 1302 and 1306, and methane (CF$_4$) is the primary etchant for thermal silicon oxide 1304. The tri-fluoro methane (CHF$_3$), in this case, acts to reduce the etching rates of the mono- and poly-crystalline silicon 1302 and 1306 to equalize them with the etching rate of the thermal oxide layer 1304.

More specifically, in step eight (8), the gas plasma pressure is set to 15 mTorr, the Helium Flow Threshold is set to 30 sccm, the RF power on the upper electrode is set to 700 Watts, the RF power on the lower electrode is set to 90 Watts, the flow rate of the hydrogen bromide (HBr) process gas is set to 40 sccm, the flow rate of the methane (CF$_4$) process gas is set to 80 sccm, the flow rate of the tri-fluoro methane (CHF$_3$) process gas is set to 50 sccm, the pressure of the Helium gas (Gas-09) on the backside of the wafer is set to six (6) Torr, the completion of the step is based on a time of 150 seconds. This completes the exemplary method of forming the shallow trench 1310 using the LAM9400 plasma etching apparatus.

FIG. 15 illustrates a table depicting an exemplary list of the steps and parameters for an AMAT MXP model plasma etch apparatus manufactured by Applied Materials Corporation used to achieve a low selectivity etch of various materials to form a shallow trench in accordance with the invention. In the preferred implementation of the method, there are seven (7) steps in the method of forming the shallow trench 1310, as listed in the top horizontal entries of the table. The first five (5) steps are preparation steps including the etching of the Bottom Antireflective Coating (BARC) 1312 and the active area nitride 1314, performed prior to the low selectivity etch of the method of the invention, which is performed in step five (5). Step seven (7) is provided to round off the bottom corners of the shallow trench 1310, which is desirable to reduce stress and high electric field concentrations in these regions. This is not needed in the LAM9400 process described above, since rounded corners are inherently formed by that process.

Step one (1) of the method of forming the shallow trench 1310 is a stability step (St). In this case, the plasma etch environment is being changed from a "turn off" environment to an etching of the Bottom Antireflective Coating (BARC) 1312 and the active area nitride layer 1314 environment as specified in step two (2). In stability step one (1), the completion of the step (designated as Step end control) is based a on time of 10 seconds. There is no endpoint detection in this step. The RF power is set to zero (0) Watt. The pressure of the process gas is set to 65 mTorr. The magnetic field is set to zero (0) Gauss. The Helium backside pressure on the wafer is set to 4000 mTorr. The flow rate for the methane ($CF_4$) process gas is set to 92 sccm. And, the flow rate for the hydrogen bromide (HBr) process gas is set to 10 sccm.

Step two (2) of the method of forming the shallow trench 1310 is a step of etching the Bottom Antireflective Coating (BARC) 1312 and an active area nitride 1314. In this step, the completion of the step is based on detecting an endpoint. The maximum time for the step is set to 100 seconds. There is an endpoint detection in this step. The RF power is set to 650 Watts. The pressure of the process gas is set to 65 mTorr. The magnetic field is set to zero (0) Gauss. The Helium backside pressure on the wafer is set to 4000 mTorr.

The flow rate for the methane ($CF_4$) process gas is set to 92 sccm. And, the flow rate for the hydrogen bromide (HBr) process gas is set to 10 sccm.

Step three (3) of the method of forming the shallow trench 1310 is to etch about 20 percent beyond the detection of the endpoint of the active nitride layer 1314 to insure that substantially all of the layer has been removed. In this step, the completion of the step is based on time, i.e. 20 percent of the time it took to the detection of the endpoint in step two (2). The maximum time for the step is set to 30 seconds. There is no endpoint detection in this step. The RF power is set to 650 Watts. The pressure of the process gas is set to 65 mTorr. The magnetic field is set to zero (0) Gauss. The Helium backside pressure on the wafer is set to 4000 mTorr. The flow rate for the methane ($CF_4$) process gas is set to 92 sccm. The flow rate for the hydrogen bromide (HBr) is set to 10 sccm.

Step four (4) of the method of forming the shallow trench 1310 is another stability step (St). In this case, the plasma etch environment is being changed from the environment used in etching the active area nitride layer 1314 as specified in step three (3) to the environment used to etch the mono-crystalline silicon layer 1302, the thermal silicon oxide 1304 and the poly-crystalline silicon 1306 as specified in step five (5). In this stability step, the completion of the step is based on a time of 315 seconds. There is no endpoint detection in this step. The RF power is set to zero (0) Watt. The pressure of the process gas is set to 100 mTorr. The magnetic field is set to 30 Gauss. The Helium backside pressure on the wafer is set to 4000 mTorr. The flow rate for the hydrogen bromide (HBr) process gas is set to 15 sccm. And, the flow rate for the methane ($CF_4$) process gas is set to 85 sccm.

Step five (5) of the method of forming the shallow trench 1310 is the etching of the 30 mono-crystalline silicon layer 1302, the thermal silicon oxide 1304 and the poly-crystalline silicon 1306. This is performed with the substantially low selective etching method of the invention. The objective here is to etch the mono-crystalline silicon layer 1302, the thermal silicon oxide 1304 and the poly-crystalline silicon 1306 such that their etch rates are substantially the same. Thus, as a result of the substantially low selective etch process of the invention, a substantially planarized bottom surface of the shallow trench 1310 is formed.

The flow rates, among other parameters of the AMAT MXP, for the active process gases (i.e. hydrogen bromide (HBr) and methane ($CF_4$)) are selected to achieve substantially the same etch rates for the mono-crystalline silicon layer 1302, the thermal silicon oxide 1304 and the poly-crystalline silicon 1306. As previously discussed, hydrogen bromide (HBr) is the primary etchant for the mono- and poly-crystalline silicon 1302 and 1306 and methane ($CF_4$) is the primary etchant for thermal silicon oxide 1304. Note, that the process gas mixture does not have an etchant suppressant in this case. This is because it was determined that the etch rates for the mono-crystalline silicon layer 1302, the thermal silicon oxide 1304 and the poly-crystalline silicon 1306 can be substantially equalized without an etch suppressant.

More specifically, in step five (5), the completion of the step is based on time, which in this case is set to 158 seconds. There is no endpoint detection in this step. The RF power is set to 650 Watts. The pressure of the process gas is set to 100 mTorr. The magnetic field is set to 30 Gauss. The Helium backside pressure on the wafer is set to 4000 mTorr. The flow rate for the hydrogen bromide (HBr) is set to 15 sccm. And, the flow rate for the methane ($CF_4$) process gas is set to 85 sccm.

Step six (6) of the method of forming the shallow trench 1310 is another stability step (St). In this case, the plasma etch environment is being changed from the environment used in etching the mono-crystalline silicon layer 1302, the thermal silicon oxide 1304 and the poly-crystalline silicon 1306 as specified in step five (5) to the environment used in rounding off the bottom of the shallow trench 1310 as specified in step seven (7). In this stability step, the completion of the step is based on a time of 10 seconds. There is no endpoint detection in this step. The RF power is set to zero (0) Watt. The pressure of the process gas is set to 80 mTorr. The magnetic field is set to 30 Gauss. The Helium backside pressure on the wafer is set to 4000 mTorr. The flow rate for the hydrogen bromide (HBr) process gas is set to 60 sccm. The flow rate for a chlorine ($CL_2$) process gas is set to 85 sccm. And, the flow rate for a mixture of Helium-Oxygen (He-02) gas is set to 15 sccm.

Step seven (7) of the method of forming the shallow trench 1310 is an etching step for rounding off the bottom of the shallow trench 1310. In this stability step, the completion of the step is based on time, which is set to 15 seconds. There is no endpoint detection in this step. The RF power is set to 500 Watts. The pressure of the process gas is set to 80 mTorr. The magnetic field is set to 30 Gauss. The Helium backside pressure on the wafer is set to 4000 mTorr. The flow rate for the hydrogen bromide (HBr) process gas is set to 60 sccm.

The flow rate for a nitrogen fluoride (NF$_3$) process gas is set to 3 sccm. And, the flow rate for a mixture of Helium-Oxygen (He—02) gas is set to 15 sccm.

III. Conclusion

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

What is claimed is:

1. A method of forming a shallow and deep trench isolation in a silicon on insulator wafer that includes a silicon on insulator (SOI) layer disposed on a buried oxide layer which is disposed on a handle wafer, comprising:

forming a layer of a hard mask oxide on said SOI layer;

forming at least one window through said mask oxide layer to expose said SOI layer;

forming a deep trench through said SOI layer by removing a portion of said SOI layer that underlies said window of said mask oxide layer;

forming a deep trench liner material;

filling said deep trench with a first electrical isolating material;

forming an active area layer over said SOI layer and over said deep trench;

forming a shallow trench over said deep trench by removing portions of said active area layer, said SOI layer, said liner material, and said first electrical isolating material; and filling said shallow trench with a second electrical isolating material.

2. The method of claim 1, wherein said forming of said shallow trench comprises performing a low-selective etching so that the etching rates for said SOI layer, said liner material, and said first electrical isolating material are substantially the same.

3. The method of claim 1, wherein said forming of said deep trench comprises removing said portion of said SOI layer to expose said buried oxide layer.

4. The method of claim 3, further comprising removing said hard mask oxide using an etching process characterized by a relatively high etching ratio of said hard mask oxide to said buried oxide layer.

5. The method of claim 1, wherein said filling of said deep trench with said first electrical isolating material comprises depositing said first electrical isolating material within said deep trench and over said SOI layer, and etching back said first electrical isolating material.

6. The method of claim 1, wherein said first electrical isolating material comprises a dielectric.

7. The method of claim 1, wherein said first electrical isolating material comprises an undoped poly-silicon.

8. The method of claim 1, wherein said active area layer comprises a nitride.

9. The method of claim 1, wherein said hard mask oxide is formed over said SOI layer using plasma-enhanced chemical vapor deposition.

10. The method of claim 1, wherein said hard mask oxide is formed over said SOI layer using SA-USG.

11. The method of claim 1, further including a step of removing said hard mask oxide using a hydrofluoric acid.

12. The method of claim 1, wherein said deep trench liner material comprises an oxide.

13. The method of claim 1, wherein said deep trench liner material comprises an oxide/nitride.

14. A method of forming a shallow and deep trench isolation in a silicon on insulator wafer that includes a silicon on insulator (SOI) layer disposed on a buried oxide layer which is disposed on a handle wafer, comprising:

forming a masking layer on said SOI layer;

forming at least one window through said masking layer to expose said SOI layer;

forming a deep trench through said SOI layer by removing a portion of said SOI layer that underlies said window of said masking layer;

filling said deep trench with a first electrical isolating material;

forming an active area layer over said SOI layer and over said first electrical isolating material;

forming a shallow trench over said deep trench by removing portions of said active area layer, said SOI layer, and said first electrical isolating material; and filling said shallow trench with a second electrical isolating material.

15. The method of claim 14, wherein said forming of said shallow trench comprises performing a substantially non-selective etching so that the etching rates for said SOI layer and said first electrical isolating material are substantially the same.

16. The method of claim 14, wherein said forming of said deep trench comprises removing said portion of said SOI layer to expose said buried oxide layer.

17. The method of claim 16, further including removing said masking layer with an etching process characterized by a relatively high etching ratio of said masking layer to said buried oxide.

18. The method of claim 14, wherein said filling of said deep trench with said first electrical isolating material comprises depositing said first electrical isolating material within said deep trench and over said SOI layer, and etching back said first electrical isolating material.

19. The method of claim 14, wherein said first electrical isolating material comprises a dielectric.

20. The method of claim 14, wherein said first electrical isolating material comprises an undoped poly-silicon.

21. The method of claim 14, wherein said active area layer comprises a nitride.

22. The method of claim 14, further including forming a liner material to line a sidewall of said deep trench.

23. The method of claim 22, wherein said liner material comprises an oxide.

24. The method of claim 14, wherein said liner material comprises an oxide/nitride.

25. A method of forming a shallow and deep trench isolation in a silicon on insulator wafer that includes a silicon on insulator (SOI) layer disposed on a buried oxide layer which is disposed on a handle wafer, comprising:

forming a layer of a hard mask oxide over said SOI layer;

forming at least one window through said mask oxide layer to expose said SOI layer;

forming a deep trench through said SOI layer by removing a portion of said SOI layer that underlies said window of said mask oxide layer to expose said buried oxide layer through said window;

forming a deep trench liner oxide material;

filling said deep trench with a first electrical isolating material comprising either a dielectric or an undoped poly-silicon;

forming an active area nitride layer over said SOI layer and over said deep trench;

forming a shallow trench over said deep trench by removing portions of said active area nitride layer, said SOI layer, said liner oxide material, and said first electrical isolating material by using a substantially non-selective etching process wherein the etching rates for said SOI layer, said liner oxide material, and said first electrical isolating material are substantially the same; and filling said shallow trench with a second electrical isolating material.

* * * * *